(12) United States Patent
Heberle et al.

(10) Patent No.: US 9,893,005 B2
(45) Date of Patent: Feb. 13, 2018

(54) IC PACKAGE

(71) Applicant: Micronas GmbH, Freiburg (DE)

(72) Inventors: Klaus Heberle, Emmendingen (DE); Joerg Franke, Freiburg (DE); Thomas Leneke, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 0 days.

(21) Appl. No.: 14/993,299

(22) Filed: Jan. 12, 2016

(65) Prior Publication Data

US 2016/0204055 A1    Jul. 14, 2016

(30) Foreign Application Priority Data

Jan. 12, 2015    (DE) .................. 10 2015 000 063

(51) Int. Cl.
*H01L 23/498*    (2006.01)
*H01L 23/31*    (2006.01)
(Continued)

(52) U.S. Cl.
CPC ...... *H01L 23/49827* (2013.01); *H01L 21/561* (2013.01); *H01L 23/3107* (2013.01);
(Continued)

(58) Field of Classification Search
CPC ......... H01L 24/32; H01L 24/48; H01L 24/73; H01L 23/49827; H01L 21/561; H01L 23/3107; H01L 23/49838
(Continued)

(56) References Cited

U.S. PATENT DOCUMENTS 5,241,454 A    8/1993    Ameen et al.
5,592,025 A    1/1997    Clark et al.
(Continued)

FOREIGN PATENT DOCUMENTS

DE    10 2007 032 142 A1    1/2009
JP    S 56-134743 A    10/1981
(Continued)

OTHER PUBLICATIONS

Andreas Veigel et al, "Einpresstechnik—Entwicklung, Anwendung, Qualifizierung," (Press-Fit Technology—Development, Application and Qualification), 1st Edition, Eugen G. Leuze Verlag, Bad Saulgau 2009, ISBN 978-3-87480-252-9, pp. 1-4.

*Primary Examiner* — Bo Fan
(74) *Attorney, Agent, or Firm* — Muncy, Geissler, Olds & Lowe, P.C.

(57) ABSTRACT

An IC package having a semiconductor body that includes a monolithically integrated circuit and at least two metallic contact surfaces. The integrated circuit being connected to the two electrical contact surfaces via printed conductors, and being disposed on a carrier substrate and connected to the carrier substrate in a force-fitting manner. The carrier substrate including at least two terminal contacts that are connected to the two contact surfaces. The semiconductor body and the carrier substrate being covered by a casting compound forming one part of the IC package. A section of each of the two terminal contacts penetrating the IC package. The two terminal contacts being disposed on the carrier substrate, and each terminal contact and the carrier substrate disposed beneath the particular terminal contacts having a hole-like formation. The particular hole-like formation being designed as a through-connection for providing an electrical connection to another electrical component.

10 Claims, 3 Drawing Sheets

(51) Int. Cl.
*H01L 23/00* (2006.01)
*H01L 21/56* (2006.01)

(52) U.S. Cl.
CPC ........ *H01L 23/49838* (2013.01); *H01L 24/32* (2013.01); *H01L 24/48* (2013.01); *H01L 24/73* (2013.01); *H01L 24/97* (2013.01); *H01L 2224/04042* (2013.01); *H01L 2224/16227* (2013.01); *H01L 2224/2919* (2013.01); *H01L 2224/32145* (2013.01); *H01L 2224/32225* (2013.01); *H01L 2224/48091* (2013.01); *H01L 2224/48225* (2013.01); *H01L 2224/48227* (2013.01); *H01L 2224/48247* (2013.01); *H01L 2224/73253* (2013.01); *H01L 2224/73265* (2013.01); *H01L 2224/8184* (2013.01); *H01L 2224/81203* (2013.01); *H01L 2224/81801* (2013.01); *H01L 2224/97* (2013.01); *H01L 2924/14* (2013.01); *H01L 2924/15156* (2013.01); *H01L 2924/15313* (2013.01); *H01L 2924/19105* (2013.01); *H01L 2924/19106* (2013.01)

(58) Field of Classification Search
USPC .......................... 257/774, 772, 770; 438/406
See application file for complete search history.

(56) References Cited

U.S. PATENT DOCUMENTS

| | | |
|---|---|---|
| 5,677,569 A | 10/1997 | Choi et al. |
| 2007/0145563 A1 | 6/2007 | Punzalan et al. |
| 2009/0256266 A1* | 10/2009 | Lao ....................... H01L 23/642 |
| | | 257/774 |
| 2009/0289336 A1 | 11/2009 | Meghro et al. |
| 2010/0170706 A1 | 7/2010 | Kimmich et al. |
| 2013/0170166 A1 | 7/2013 | Ziglioli et al. |

FOREIGN PATENT DOCUMENTS

| | | |
|---|---|---|
| JP | S 58-158955 A | 9/1983 |
| JP | H 01-196153 A | 8/1989 |
| JP | H 04-162656 A | 6/1992 |
| JP | H 04-280696 A | 10/1992 |
| JP | H0563138 A | 3/1993 |
| JP | H 05-343602 A | 12/1993 |

* cited by examiner

IC PACKAGE

This nonprovisional application claims priority under 35 U.S.C. §119(a) to German Patent Application No. 10 2015 000 063.2, which was filed in Germany on Jan. 12, 2015, and which is herein incorporated by reference.

BACKGROUND OF THE INVENTION

Field of the Invention

The invention relates to an IC package.

Description of the Background Art

An electronic module is known from DE 10 2007 032 142 A1, which corresponds to US 2010/0170706. A contacting device is known from Andreas Veigel et al, "Einpresstechnik-Entwicklung, Anwendung, Qualifizierung," (Press-Fit Technology—Development, Application and Qualification), 1st Edition, Eugen G. Leuze Verlag, Bad Saulgau 2009, ISBN 978-3-87480-252-9.

SUMMARY OF THE INVENTION

It is therefore an object of the invention to provide a device which refines the prior art.

According to an embodiment of the invention, an IC package comprising a semiconductor body is provided, the semiconductor body including a monolithically integrated circuit and at least two metallic contact surfaces, and the integrated circuit being connected to the two electrical contact surfaces with the aid of printed conductors, and the semiconductor body being disposed on a carrier substrate and being connected to the carrier substrate in a force-fitting manner, and the carrier substrate including at least two terminal contacts, and the two terminal contacts being connected to the two contact surfaces, and the semiconductor body and the carrier substrate being covered by a casting compound, the casting compound forming one part of the IC package, and a section of each of the two terminal contacts penetrating the casting compound of the IC package, the two terminal contacts being disposed on the carrier substrate, and each terminal contact forming a hole-like formation with the carrier substrate situated beneath the particular terminal contact, the particular hole-like formation being designed as a through-connection for the purpose of providing an electrical connection to another electrical component.

The term, hole-like formation, can designate a continuous opening in the carrier substrate, and the walls in the opening can be metallically conductive for the purpose of thereby forming an electrically conductive through-connection. In particular, the through-connection can have a sleeve-like design.

The IC package can be formed from the casting compound and the carrier substrate. Alternatively, it is also preferred to form the package exclusively with the aid of the casting compound, in other words, to completely surround the inner components with the casting compound.

The carrying capacity of the carrier substrate can be sufficient to receive the terminal contacts and the through-connections before forming the IC package with the aid of the casting compound. It should be noted that the designation, "lead frame," can also be customary for the carrier substrate, for example, when the carrier substrate is made of a metal or of multiple metal strips.

The IC package can be electrically connectable directly to another component with the aid of a direct through-connection formed with the IC package. Mounting the IC package on a carrier board, the carrier board containing the through-connection, is dispensed with. In other words, one connecting plane may be eliminated with the device according to the invention, in that the through-connections of the IC package may be connected to a higher-level system, such as a connector or a cable, for example, with the aid of a press-fit pin. The yield may be increased and the assembly costs reduced hereby.

In an embodiment, the carrier substrate can include or can be made of an electrically insulating material. Plastic connections or metal/plastic connections are preferred as the material of the carrier substrate, for example so-called "molded interconnect devices" in the form of injection molded parts. The terminal contacts can be provided as metallic strips on the carrier substrate.

In an alternative metallic design of the carrier substrate, there is no need to provide metallic strips on the surface of the carrier substrate, in that the terminal contacts themselves are made of individual metallic strips which are, however, insulated from each other.

The through-connections can have a circular cross section. The aspect ratio, between the length and the diameter of the through-connection, can be at least greater than or equal to 1.

Pins may be press-fitted or soldered into the through-connections. It can be advantageous to provide a metallic surface in the through-connections on the inside of the hole, the metallic surface can also be designed as part of the outer contact and can be connected to form a single piece with the outer contact.

The through-connection can be connected to the carrier substrate in a force-fitting and integral manner. Particularly durable and low-resistance connections may be established hereby.

In an embodiment, the contact surfaces can be electrically connected to the terminal contacts via a conductive adhesive or via a bonding wire or with the aid of a solder joint or with the aid of sintering or with the aid of a thermocompression bond.

In an embodiment, another electronic component can be disposed on the carrier substrate at a distance from the semiconductor body and cover both components with the same casting compound in one method step. An example of the two components can be Hall sensors, which can be disposed either laterally or in the form of a stack within the IC package.

In another embodiment, the carrier substrate can be designed as a planar plate. In an alternative embodiment, the carrier substrate can have a trough-shaped formation on an upper side, the semiconductor can be disposed in a base area of the trough-shaped formation.

All through-connections can be provided in an edge region of the carrier substrate. In an embodiment, one or multiple semiconductor bodies and/or one or multiple electronic components can be disposed both on and beneath the carrier substrate. Multichip solutions may be easily and cost-effectively manufactured hereby without requiring a carrier board.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 5b shows a top view along line A-A' of the embodiment of the IC package according to the invention illustrated in FIG. 5a.

DETAILED DESCRIPTION

Figure 1:
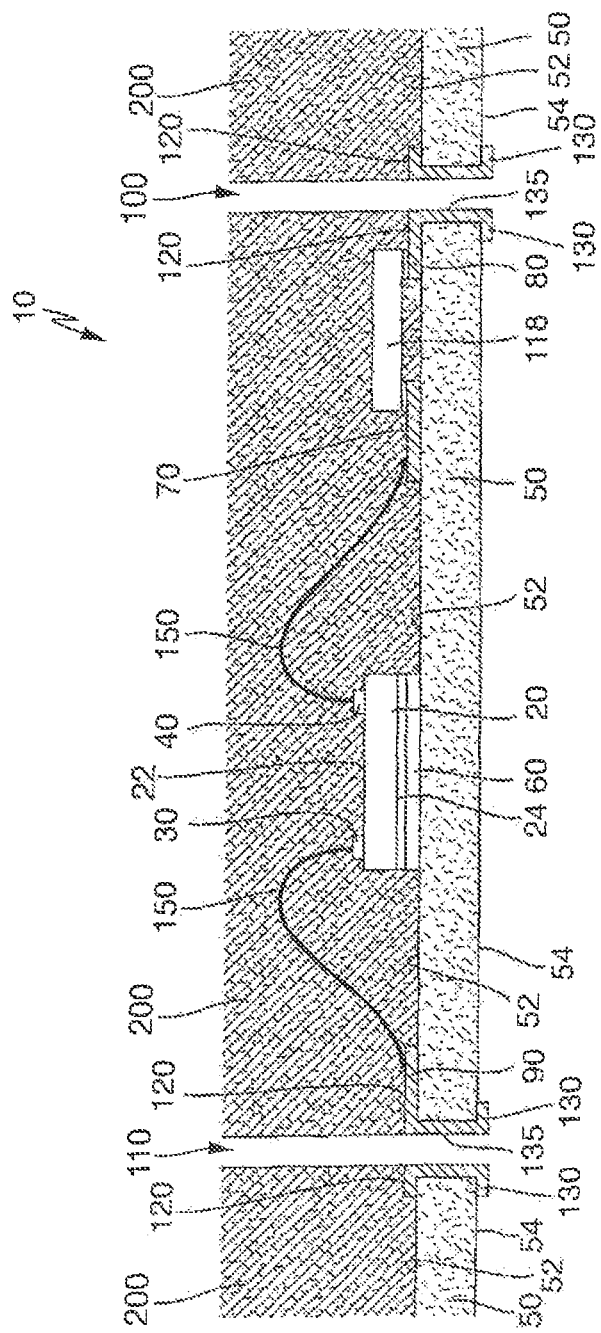
FIG. 1 shows a cross-sectional view of an embodiment of an IC package according to the invention.

The illustration in FIG. 1 shows a schematic view of a first specific embodiment, including an IC package 10 which comprises a semiconductor body 20 having an upper side 22 and an underside 24. Semiconductor body 20 includes a monolithically integrated circuit, which is not shown and which has a first metallic contact surface 30 and a second metallic contact surface 40. The two contact surfaces 30 and 40 are provided on upper side 22 of semiconductor body 20.

The integrated circuit is connected to the two electrical contact surfaces 30 and 40 with the aid of printed conductors, which are not shown. A carrier substrate 50, which has an upper side 52 and an underside 54, is furthermore provided. Underside 24 of semiconductor body 20 is connected to carrier substrate 50 on upper side 52 of carrier substrate 50 in a force-fitting manner with the aid of an adhesive joint 60. Adhesive joint 60 is preferably designed as a double-sided adhesive film. Carrier substrate 50 includes a first metal surface 70 and a first terminal contact 80 and a second terminal contact 90. The two terminal contacts 80 and 90 include a through-connection 100 provided in a hole-like manner through carrier substrate 50 and a second through-connection 110 provided in a hole-like manner through carrier substrate 50. The two through-connections 100 and 110 have a circular cross section and are provided in an edge area of carrier substrate 50.

A first electronic component 118 is connected to first metal surface 70 and to first terminal contact 80. First terminal contact 80 is connected to first through-connection 100, and second terminal contact 90 is connected to second through-connection 110; particular terminal contacts 80 and 90 are provided on the insides of the two through-connections 100 and 110. With respect to the two through-connections, the two terminal contacts 80 and 90 form an edge surface 120 on upper side 52 of carrier substrate 50 and an edge surface 130 on underside 54 of carrier substrate 50. The two edge surfaces 120 and 130 and insides 135 are each preferably designed to form a single piece with particular terminal contact 80 and 90.

The two contact surfaces 30 and 40 are each connected to second terminal contact 90 and first terminal contact 80 with the aid of a bonding wire 150. Electrical contact surface 40 in the present case is connected to first metal surface 70. First component 118 is connected to first metal surface 70 and first terminal contact 80. In other words, second contact surface 40 forms a series connection with first metal surface 70 and first component 118 and first terminal contact 80. A casting compound 200 is provided on entire upper side 52 of carrier substrate 50, so that bonding wires 150, semiconductor body 20 and first electronic component 118, among other things, are covered or surrounded by casting compound 200. Underside 54 of carrier substrate 50 and through-connections 100 and 110 on upper side 52 of carrier substrate 50 are free of casting compound 200 to ensure an electrical contacting with additional modules. Parts of plug connections, among other things, are included as modules. Carrier substrate 50 is preferably designed as a single piece in the form of a plate made of an electrically insulating material. The plate preferably has a thickness of less than 2 mm, at maximum preferably a thickness of less than 0.5 mm. It is furthermore preferred that IC package 10 has a cuboid shape.

Figure 2:
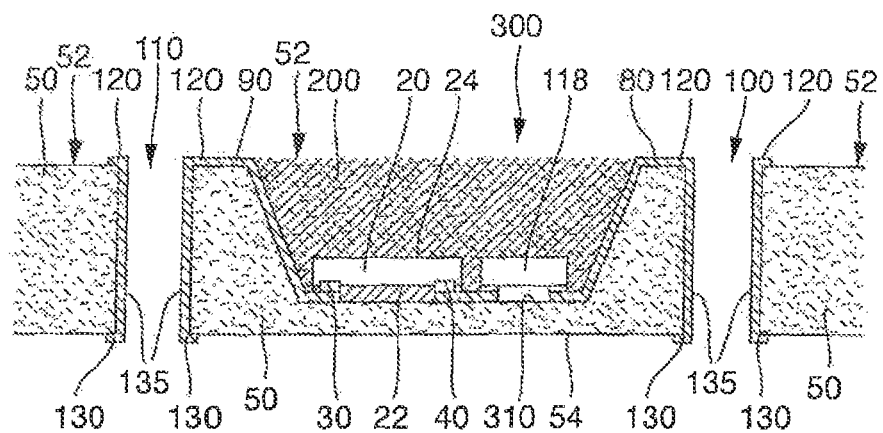
FIG. 2 shows a cross-sectional view of an embodiment of an IC package according to the invention.

A cross-sectional view of a second specific embodiment of an IC package 10 according to the invention is illustrated in FIG. 2. Only the differences from the first specific embodiment illustrated in FIG. 1 are explained below. Carrier substrate 50 has a trough-shaped formation 300, including a base area 310, on its upper side 52, preferably in the middle. Semiconductor body 20 and electronic component 118 are disposed side by side in base area 310, which has, in particular, a planar design. Upper side 22, including the two contact surfaces 30 and 40 of semiconductor body 20, point in the direction of base area 310. The two contact surfaces 30 and 40 are electrically connected to second terminal contact 90 and first terminal contact 80. The two terminal contacts 80 and 90 include printed conductor sections, printed conductor sections extending over the edge of trough to first terminal contact 80 and to second terminal contact 90 and being connected to assigned terminal contact 80 and 90, in each case. In the present case, only the trough is filled with casting compound 200; i.e., remaining upper side 52 of carrier substrate 50 as well as underside 54 of carrier substrate 50 do not have any casting compound.

Figure 3:
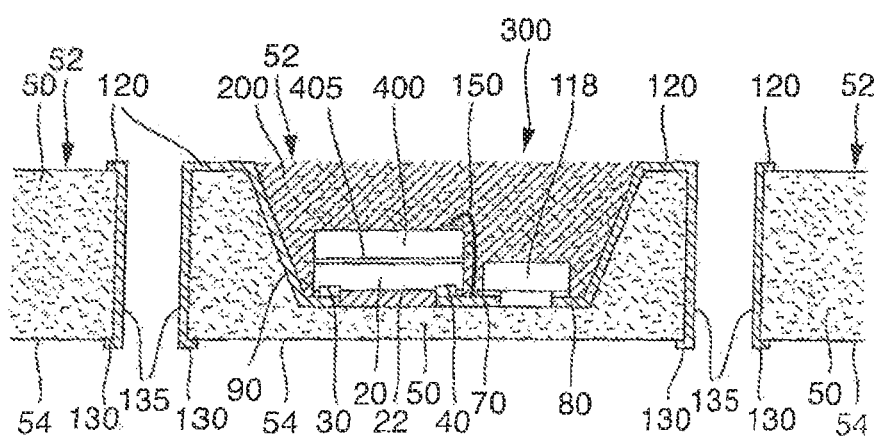
FIG. 3 shows a cross-sectional view of an embodiment of an IC package according to the invention.

A cross-sectional view of a third specific embodiment of an IC package 10 according to the invention is illustrated in FIG. 3. Only the differences from the second specific embodiment illustrated in FIG. 2 are explained below. In trough-shaped formation 300, which includes a base area 310, another semiconductor body 400 is disposed on an adhesive layer 405 on first semiconductor body 20, second semiconductor body 400 being connected to terminal contacts 80 and 90 with the aid of bonding wires 150.

Figure 4:
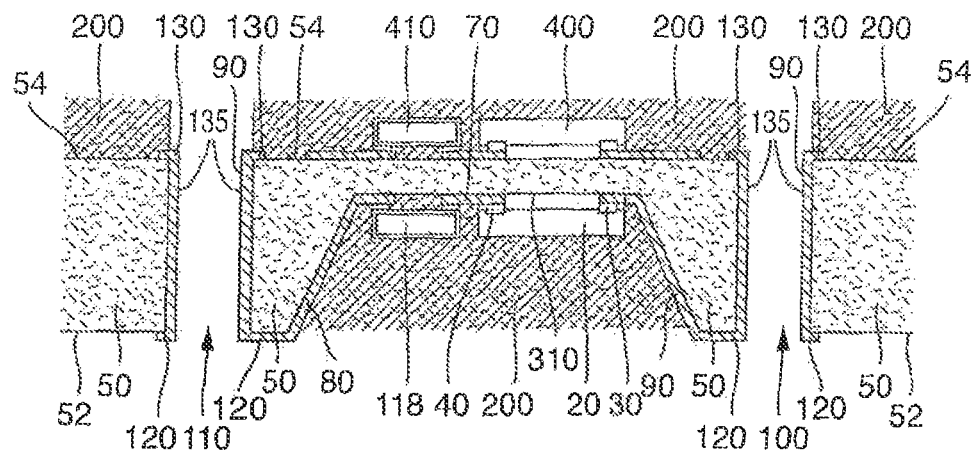
FIG. 4 shows a cross-sectional view of an embodiment of an IC package according to the invention.

A cross-sectional view of a fourth specific embodiment of an IC package 10 according to the invention is illustrated in FIG. 4. Only the differences from the second specific embodiment illustrated in FIG. 2 are explained below. Second semiconductor body 400 is disposed on underside 54 of carrier substrate 50 with the aid of the conductive adhesive. In addition to second semiconductor body 400, a second electronic component 410 is also disposed on underside 54. With the exception of through-connections 100 and 110, carrier substrate 50 is covered by casting compound 200 on underside 54, so that components 400 and 410 are also covered by casting compound 200.

Figure 5A:
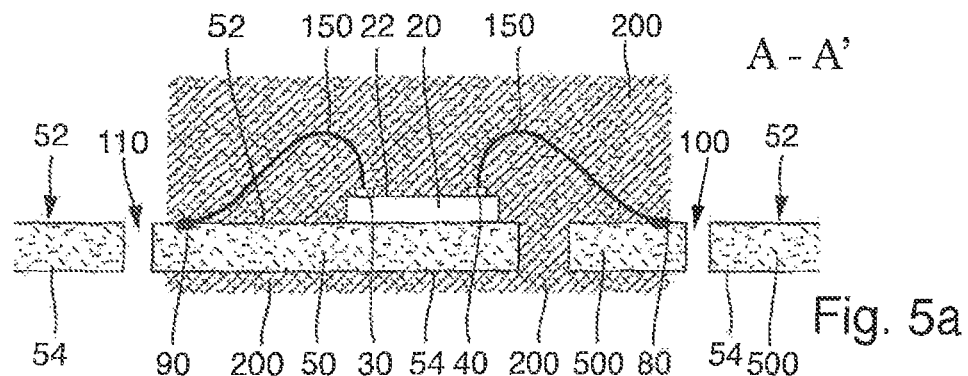
FIG. 5a shows a cross-sectional view of an embodiment of an IC package according to the invention.

A cross-sectional view along a line A-A' of a fifth specific embodiment of an IC package 10 according to the invention is illustrated in FIG. 5a. Only the differences from the first specific embodiment illustrated in FIG. 1 are explained below. Carrier substrate 50 is now provided with a multi-part design and is made from a metal; in particular, first terminal contact 80 is disposed on a separate part 500 of carrier substrate 50. First through-connection 100 is provided on separate part 500, which may also be referred to as a pin. In that a metal is present, the bonding wire may be connected directly to first terminal contact 80 without first terminal contact 80 being designed as a side wall in through connection 100, 110.

Casting compound 200 on upper side 52 is disposed only in the area of first semiconductor body 20 and bonding wires 150 and also in the central area of carrier substrate 20 on underside 54.

Figure 5B:
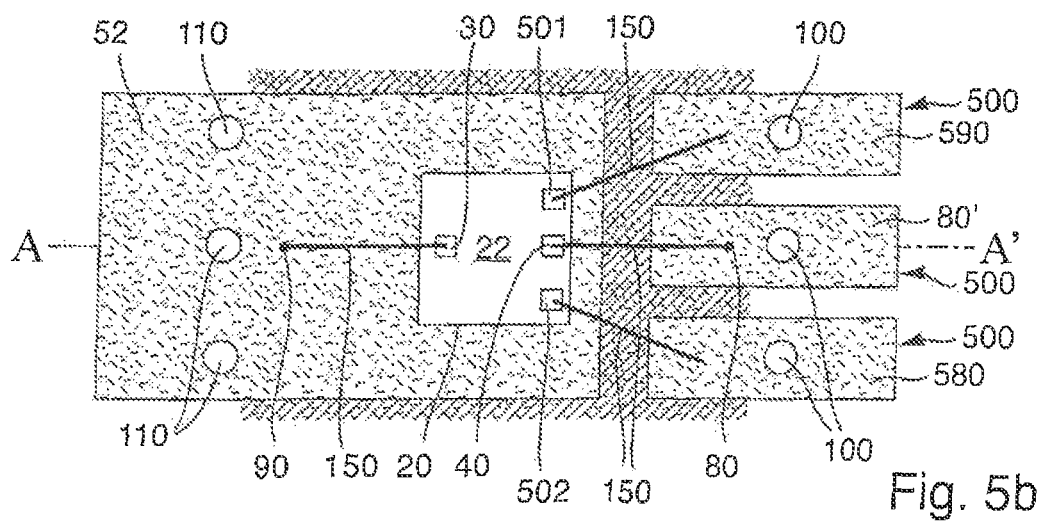

FIG. 5*b* shows a top view of the fifth specific embodiment of IC package 10 according to the invention illustrated in FIG. 5*a*. Only the differences from the specific embodiment illustrated in FIG. 5*a* are explained below. A total of four contact surfaces 30, 40, 501 and 502 and four separate terminal contacts 80, 90, 580 and 590 are now disposed on upper side 22 of semiconductor body 20, all contact surfaces 30, 40, 501 and 502 being connected to individual terminal contacts 80, 90, 580 and 590 with the aid of an assigned bonding wire 150. Separate part 500 includes contact surfaces 80, 580 and 590. Through-connections 100 and 110 are provided in the individual terminal areas for each pin. There is no need to provide metallic contact surfaces on the carrier substrate.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An IC package comprising:
   a semiconductor body having a monolithically integrated circuit and at least two metallic contact surfaces, the integrated circuit being connected to the two electrical contact surfaces via printed conductors; and
   a carrier substrate, the semiconductor body being disposed on the carrier substrate and integrally connected to the carrier substrate, the carrier substrate having at least two terminal contacts being connected to the two contact surfaces,
   wherein the semiconductor body and the carrier substrate are covered by a casting compound, the casting compound forming one part of the IC package, and an extension portion of each of the two terminal contacts is covered by casting compound,
   wherein the extension portion of each of the two terminal contacts protrude from the carrier substrate into the casting component of the IC package, and
   wherein the two terminal contacts are disposed on the carrier substrate, and the two terminal contacts form a hole-like formation with the carrier substrate situated beneath the two terminal contacts, the hole-like formation being adapted as a through-connection for providing an electrical connection to another electrical component.

2. The IC package according to claim 1, wherein the carrier substrate includes an electrically insulating material or is made of an electrically insulating material.

3. The IC package according to claim 1, wherein the through-connections have an aspect ratio between a length and a diameter of the through-connection which is greater than or equal to 1.

4. The IC package according to claim 1, wherein the through-connections are provided with a metallic surface on an inside of the hole as part of an outer contact and are connected with the outer contact to form a single piece.

5. The IC package according to claim 1, wherein the contact surfaces are electrically connected to the terminal contacts via a conductive adhesive or via a bonding wire or with the aid of a solder joint or with the aid of sintering or with the aid of a thermocompression bond.

6. The IC package according to claim 1, wherein another electronic component is disposed on the carrier substrate at a distance from the semiconductor body and covered with the casting compound.

7. The IC package according to claim 1, wherein the carrier substrate is designed as a planar plate.

8. The IC package according to claim 1, wherein the carrier substrate has a trough-shaped formation on an upper side, and wherein the semiconductor body is disposed in a base area of the trough-shaped formation.

9. The IC package according to claim 1, wherein the through-connections are provided in an edge area of the carrier substrate.

10. The IC package according to claim 1, wherein the hole-like formation is a continuous opening, and wherein the opening is metallically conductive on an inside.

* * * * *